US008563916B2

(12) United States Patent
Lotto et al.

(10) Patent No.: US 8,563,916 B2
(45) Date of Patent: Oct. 22, 2013

(54) COMPACT LOW NOISE SIGNAL READOUT CIRCUIT HAVING AT LEAST ONE OPEN-LOOP AMPLIFIER AND METHOD FOR OPERATING THEREOF

(75) Inventors: Christian Lotto, Zürich (CH); Peter Seitz, Urdorf (CH); Simon Neukom, Uster (CH)

(73) Assignee: CSEM Centre Suisse d'Electronique et de Microtechnique SA—Recherche et Developpement, Neuchatel (CH)

( * ) Notice: Subject to any disclaimer, the term of this patent is extended or adjusted under 35 U.S.C. 154(b) by 436 days.

(21) Appl. No.: 13/026,524

(22) Filed: Feb. 14, 2011

(65) Prior Publication Data

US 2011/0199106 A1    Aug. 18, 2011

(30) Foreign Application Priority Data

Feb. 15, 2010   (EP) ..................................... 10153627

(51) Int. Cl.
*H01L 27/00*        (2006.01)
(52) U.S. Cl.
USPC .................................... 250/208.1; 250/214 R
(58) Field of Classification Search
USPC ........... 250/208.1, 214 R, 214 A, 332, 338.4; 348/234–311; 327/95, 514
See application file for complete search history.

(56) References Cited

U.S. PATENT DOCUMENTS 7,911,512 B2 *   3/2011   Henderson .................... 348/234

FOREIGN PATENT DOCUMENTS

| EP | 1301028 A1 | 4/2003 |
| WO | WO2008/146236 | 12/2008 |

* cited by examiner

*Primary Examiner* — Que T Le
(74) *Attorney, Agent, or Firm* — Preti Flaherty Beliveau & Pachios LLP (57) ABSTRACT

The present invention discloses a solid-state electric charge sensor (200, 600) comprising at least one signal-readout circuit (205, 605) that comprises a current source (140, 640) and a column line (120, 620). The sensor also comprises at least one charge detector circuit (210, 610) that is operatively coupled with the at least one signal-readout circuit (205, 605). The at least one signal-readout circuit (205, 605) is characterized by further comprising at least one open-loop amplifier (250, 650), the input of which is operatively connectable with the at least one column signal line (220, 620) and with the at least one current source (240, 640); at least one feedback line (230, 630) that is operatively connectable with the output (254, 654) of the at least one open-loop amplifier (250, 650); and operative to selectively form a negative feedback loop; and wherein the open-loop amplifier (250, 650) has an inverting voltage gain.

18 Claims, 7 Drawing Sheets

COMPACT LOW NOISE SIGNAL READOUT CIRCUIT HAVING AT LEAST ONE OPEN-LOOP AMPLIFIER AND METHOD FOR OPERATING THEREOF

FIELD OF THE INVENTION

The current invention generally relates to electric charge sensors. In particular the invention relates to low-noise, high-sensitivity, and high-dynamic-range charge sensors implemented with Complementary Metal Oxide Semiconductor (CMOS) fabrication technology.

DESCRIPTION OF THE FIGURES

Features and advantages of the invention will become apparent in the light of the ensuing description of some embodiments thereof, given by way of example only, with reference to the accompanying figures, wherein.

BACKGROUND OF THE INVENTION

Solid-state image sensors offering low readout noise, high sensitivity and high dynamic range are devices of major interest in many fields such as digital consumer cameras, machine vision, life science imaging applications and night vision systems.

Reduction of electronic readout noise in Complementary Metal Oxide Semiconductor (CMOS) image sensors relying on conventional architectures, especially those operated at standard video frame rates or those optimized for still picture acquisition requires high values of capacitances for the implementation of necessary low-pass filters with particularly low bandwidth. Manufacturing of these capacitances demands significant silicon area and therefore results in increased device cost and larger chip area.

Figure 1:
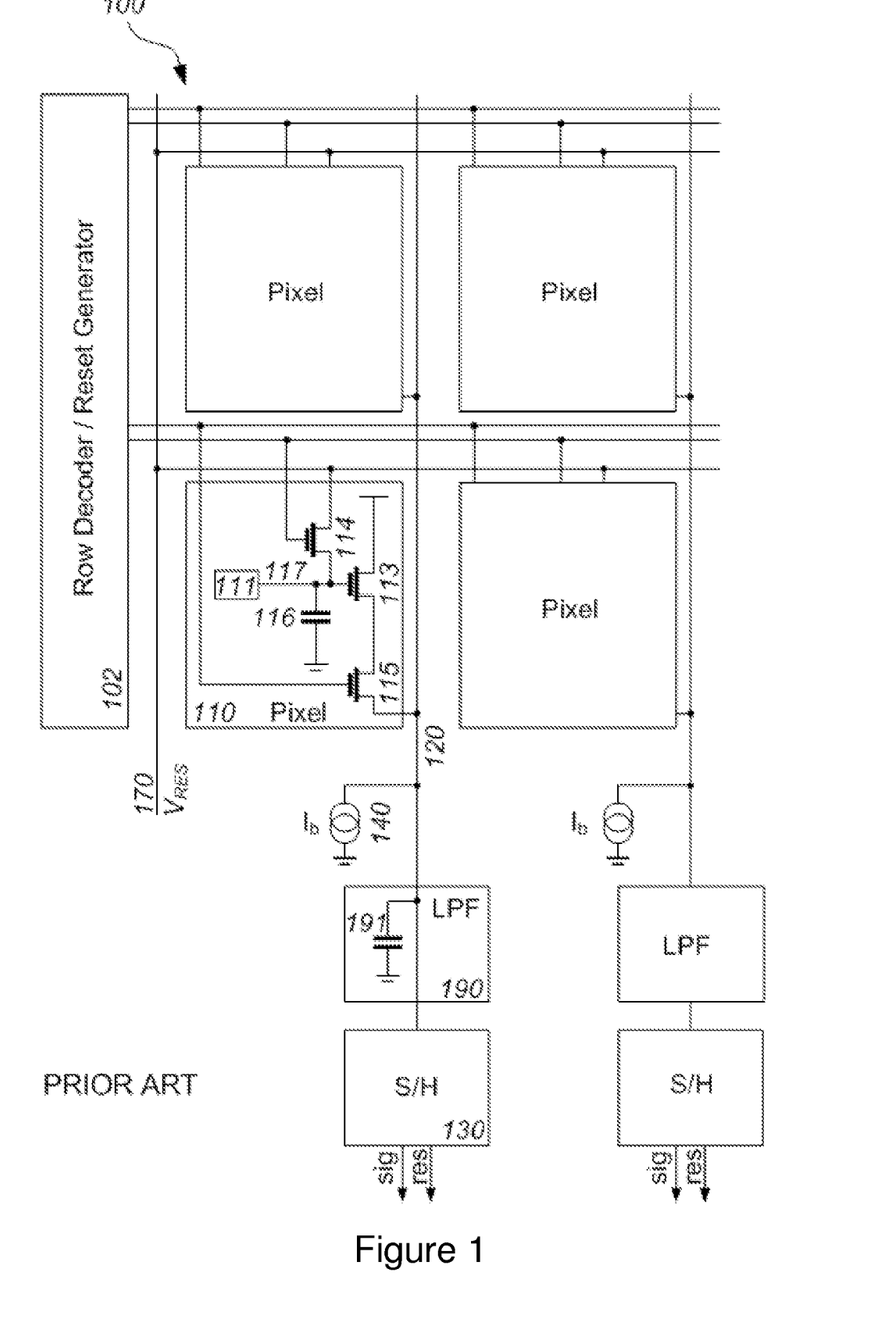
FIG. 1 is a schematic illustration of an image sensor according to the prior art.

With reference to FIG. 1 a prior art image sensor 100 includes a matrix of pixel circuits 110 and a number of column signal lines 120. Each pixel circuit 110 includes a photo-sensitive device 111, such as a buried photodiode with a transfer gate, a photogate, a charge coupled device (CCD) or a p-n-photodiode, a source-follower transistor 113, a reset transistor 114, a select transistor 115, and a sense node capacitor 116 which may be implemented as a parasitic capacitance. Various elements such as source-follower transistor 113 and/or sense node capacitor 116 may be shared among neighbouring pixels in order to reduce transistor count. Depending on the selection of shared elements and the number of pixels sharing a given element, such pixels are for example referred to as 1.25-T, 1.5-T, 1.75-T or 2T pixels. Image sensor 100 further includes a low-pass filter (LPF) 190 and a current source 140 which are connected to every column signal line 120. LPF 190 and/or current source 140 may also be shared with a plurality of pixel circuits 110. A sample-and-hold (S/H) circuit 130 is connected to the output of each LPF 190.

A row decoder 102 generates the control signals for reset transistors 114 and select switches 115 of each pixel circuit 110. A common reset voltage grid 170 is connected to all pixel circuits 110 of the matrix.

During the readout of a given pixel circuit 110, reset transistor 114, the transfer gate of photo-sensitive device 111 if implemented by a buried photodiode, as well as the controls of S/H circuit 130 are operated in a manner which allows consecutive sampling of the reset value and the signal value and holding of the two values on the output of S/H circuit 130.

During both sampling processes, thermal noise generated in the channel of source-follower transistor 113 is sampled and held by S/H circuit 130. Further electronic circuits or software may be used for subtracting the sampled reset value from the signal value for cancellation of pixel reset noise and the offset of source-follower transistor 113. This subtraction process is commonly referred to as correlated double sampling (CDS). Since the thermal noise components of the signal value and the reset value held by S/H circuit 130 are not sampled simultaneously, they are not correlated. Therefore, the thermal noise of source-follower transistor 113 and current source 140 is not cancelled by CDS and the statistical variation of the thermal noise voltage is increased by a factor of sqrt(2) when determining a difference of two samples.

The application of low-pass filtering has been shown to be an adequate method for controlling thermal noise of image sensors, as taught for example in European Patent EP1643754 (Seitz et al.). The task of low-pass filtering is accomplished by LPF 190. A possible implementation of this approach is achieved by using the natural LPF characteristics of the capacitance-loaded source-follower buffer setup including a source-follower transistor 113, current source 140, and a load capacitor 191 for low-pass filtering. In this case the input and output node of low-pass-filter 190 are identical. The load capacitance of the source follower buffer setup includes the parasitic capacitance of column signal line 120, the capacitance of load capacitor 191, and the input capacitance of S/H circuit 130. S/H circuit 130 include at least one sampling switch (not shown) and a sampling capacitor (not shown) for the reset value as well as for the signal value. In some cases, the sampling capacitors may take the role of low-pass filtering load capacitors 191 if their dimensions, and thus the corresponding capacitances, are chosen large enough. The thermal noise level is controlled by proper choice of the capacitance load of the source-follower transistor 113. In practical designs it is usually possible to reduce the thermal noise contributed by current source 140 to an amount significantly below the thermal noise contributed by source-follower transistor 113. The thermal noise contained in either the reset value or the signal value can therefore be approximated by the thermal noise of source-follower transistor 113, as given by the following equation (EQN) 1:

$$q_{sn,thermal,conventional} \approx C_{sn,conventional} \sqrt{\frac{\gamma kT}{C_{load,conventional}}} \quad (1)$$

wherein $q_{sn,thermal,conventional}$ is the root-mean-square (RMS) of the equivalent noise charge (ENC) at a sense node 117 to the thermal noise contained in the reset value or the signal value, $C_{sn,conventional}$ is the capacitance of sense node capacitor 116, $C_{load,conventional}$ is the overall capacitance of column signal line 120 while sampling the reset value or signal value, k is the Boltzmann constant, T is the absolute temperature, and γ is the thermal noise excess factor of a MOS transistor.

For currently used semiconductor manufacturing technologies it is reasonable to assume, for example, a value of 2 for γ and a value of 5 femto-Farads for $C_{sn,conventional}$. For ultra-low-noise sensors with overall RMS noise of the order of one electron, thermal noise from source-follower transistor 113 and current source 140 should not exceed the value of about 0.5 electrons at room temperature. From EQN 1 and the assumed values it becomes apparent that $C_{load,conventional}$ needs to take a value of, for example, 66 pico-Farads in order to achieve this requirement for the difference value, determined by CDS. If the majority of load capacitance is contributed by the sampling capacitors used in S/H circuit 130, or otherwise stated, capacitances of the sampling capacitors are larger than another capacitance like e.g. parasitic capacitance of column signal line 120 and/or of a dedicated additional low-pass filtering load capacitor 191, and equal capacitance values are used for the sampling capacitors of the reset value and signal value sampling, the sum of the capacitance required per column signal line 120 is as high as 132 pico-Farads in the considered example. If a state-of-the art CMOS manufacturing process is used, a limited capacitance density, as for example 5 femto-Farads per $\mu m^2$, can be achieved. The area of the capacitors needed to attain the required capacitance per column signal line would therefore be as high as 5 mm by 5 μm, which means that the area used by the capacitors is of an order of magnitude comparable to the area of the pixel array. Ultra-low-noise CMOS image sensors based on the described architecture can therefore not be produced at competitive package size and manufacturing cost.

A further limitation of the prior art image sensor architecture, as depicted in FIG. 1, is the fact that the conversion factor between signal charge and the voltage difference of the reset and signal values sampled by S/H circuit 130 is mainly defined by the value of sense node capacitance $C_{sn}$ as the signal chain does not employ or provide any voltage amplification.

Image sensors with a column circuit employing an inverting capacitance feedback amplifier have been proposed, for example by Krymski et al. (A 2e noise 1.3 Megapixel Sensor, in Proc. 2003 IEEE Workshop on CCDs and Advanced Image Sensors, Bruges, Belgium, May 15-17, 2003). These column circuits include an amplifier, an input capacitance coupling the column signal to a virtual ground node of the amplifier, and a feedback capacitance connected between the virtual ground node and the amplifier output. By resetting the charge of the feedback capacitance while the column line voltage corresponds to the reset level, the switched capacitor amplifier will perform subtraction of the reset level and the signal level as soon as the signal level is provided on the column signal line. Such a column circuit thus provides embedded CDS functionality. Furthermore, this architecture of column circuit may provide voltage amplification if the ratio of the feedback capacitance over the input capacitance is suitably chosen. The described switched capacitor amplifier based column circuit, however, does not perform perfect low-pass filtering of the processed column line signal, because the small signal transfer function of the described column circuit contains, besides the dominant pole at low frequency, a zero. As is known in the art, the term "small signal transfer function" refers to the frequency dependent input-to-output characteristics for signals that are small enough to allow linear approximation of the circuit behaviour. The small signal transfer function thus has a constant frequency response beyond the complex frequency of the zero rather than increasing attenuation. For this reason, to achieve effective suppression of high-frequency components of thermal noise, the employment of a large filtering capacitor connected to the column signal line would be needed nevertheless. Furthermore, the transistors included in the amplifier of this column circuit contribute additional thermal noise to the processed column line signal. This thermal noise contribution may, depending on various design parameters, significantly deteriorate the overall noise performance of the sensor.

DESCRIPTION OF THE INVENTION

It is an object of the invention to provide a signal-readout circuit and method with improved noise performance and operative with charge detector circuits of sensors like, e.g., image sensor and/or micro-electrode arrays.

To simplify the discussion that follows, the term "electric charge sensor" is herein referred to as "image sensor", the term "charge detector" as "pixel", the term "charge detector circuit" as "pixel circuit"; and the term "charge output transducer" as "photosensitive device". These simplifications should however be referred to as examples only and should thus by no means to be construed as limiting. Accordingly, embodiments of the disclosed invention are employable in a variety of sensors operative to detect and readout electric charge including for example, micro-electrode arrays.

The present invention discloses a signal-readout circuit with extremely low readout noise which inter alia includes a column signal line and which is operative with image sensors employing a plurality of pixels. Accordingly, pixels may be implemented with pixel circuits that include a photosensitive device, a buffer device (implemented e.g., by a source-follower transistor), a select switch, a reset transistor and a readout node. The photosensitive device, wherein electric charge is generated by incident light, may be embodied by a p-n-photodiode, a buried photodiode, a photogate or a charge coupled device (CCD).

The output of the pixel's buffering device is connected with a select switch to a common column signal line, terminated by an amplifier exhibiting a bandwidth that can be limited to an optimum value by an amplifier load capacitance with respect to noise, i.e., the bandwidth is kept as small as possible to reduce noise, but large enough to keep the image sensor operative at a desired speed or frame rate. The amplifier is selectively operable in an open-loop configuration and is thus hereinafter referred to as "open-loop amplifier". The open-loop amplifier has moderate gain ranging for example between 2 and 100, and is employed for readout of reset and signal level, wherein the input of each open-loop amplifier is connected to the corresponding column signal line. By activating the select switch of the pixel circuit, the latter is connected to a corresponding column signal line.

Low-noise readout of a charge detector is implemented with a correlated multiple sampling technique such as correlated double sampling (CDS), according to which the signals from the pixel are read at least twice during an amplification phase. First of all the reset level of the sense node is established during a reset phase. The level on the column signal line during reset phase is however not relevant and will not be sampled. During a following amplification phase (which may also be referred to as "readout phase") two phases can be identified. In the first phase, at the beginning of the amplification phase (before charge transfer or continuous charge integration) the reset level of the signal on the column signal line is established (based on the reset level of the sense node) and sampled at least once and in the second phase, after charge transfer or charge integration, the signal level of the column signal line is established and sampled at least once.

The amplification phase is obtained by opening at least one of the column feedback transistors and the reset transistor of the pixel. The signal levels on the sense node of the pixel and on the column signal line are established by transferring the stored charge signal to the sense node using a transfer switch such as for example the transfer gate of a pinned photodiode or by directly integrating charge on the sense node during an integration period after reset. Otherwise stated, the charge signal generated by the photosensitive device is transferred to or directly integrated on the sense node of the image sensor, wherein the sense node is electrically connected to the buffer device, and to the reset transistor.

The reset phase is obtained by at least approximately simultaneously closing the column feedback transistor and the reset transistor of the pixel. The feedback line is connected to the drain of all reset transistors of the pixels in this column, and this feedback line is also connected to the output of the signal column's open-loop amplifier through a column feedback transistor. Therefore, the output of each open-loop amplifier is connected to the sense node of the corresponding pixel circuit across a feedback line and the reset transistor of the pixel circuit. Thusly configured, negative feedback can be provided from the output to the input of the open-loop amplifier, the negative feedback setting the reset voltage of the column signal line to a non-saturating input voltage of the open-loop amplifier.

Due to the bandwidth reducing effect of amplification and improved high-frequency attenuation obtained when using an open-loop amplifier, the bandwidth of the output signal may be reduced to the lowest value still fulfilling the output rate requirement at a highly reduced expense of load capacitance compared to a prior art sensor with an equally low thermal noise power spectral density (PSD) of its source-follower transistor. Thus, no particular filtering capacitance needs to be connected to the column signal line.

The bandwidth limiting effect of open-loop amplification also allows reducing the self-generated thermal noise of the open-loop amplifier to a desired level requiring only small values of load capacitance. Embodiments of the invention are also characterised by the low input capacitance per gate area of source-follower transistors known from prior art image sensors. The very low sense node referred noise voltage achieved by embodiments of the invention thus results in very low sense node equivalent noise charge (ENC).

According to an embodiment of the invention, the dimensions and bias current of the source-follower transistor are chosen such that the bandwidth of the column signal line is significantly higher (e.g., by at least 2 to 10 times) than needed to meet the output rate requirement of the image sensor. Therefore, the signal-readout circuit according to embodiments of the invention employed in, e.g., image sensors, provides effective reduction of thermal noise from front-end readout circuits of Complementary Metal Oxide Semiconductor (CMOS) image sensors, such as for example in-pixel source follower transistors, by low-pass filtering. Summarizing, the signal-readout circuit according to embodiments of the invention ensures very low overall electronic noise at reduced expenditure of semiconductor die area compared to prior art signal-readout circuits.

SUMMARY OF THE EMBODIMENTS OF THE INVENTION

The present invention discloses a solid-state electric charge sensor comprising at least one charge detector circuit operatively coupled with at least one signal-readout circuit which comprises a current source and a column line.

In embodiments, the at least one signal-readout circuit further comprises at least one open-loop amplifier having an output node and an input node wherein the input node is operatively connected with the at least one column signal line and with the at least one current source; at least one feedback line that is operatively connectable with the output of the at least one open-loop amplifier; wherein the at least one charge detector circuit, which comprises a sense node, is selectively connectable with one of the feedback lines to form a negative feedback loop; and wherein the open-loop amplifier has an inverting voltage gain.

In embodiments, the bandwidth of the at least one open-loop amplifier is smaller than the bandwidth of the signal on the at least one column signal line.

In embodiments, the open-loop amplifier is a common-source amplifier comprising a load transistor.

In embodiments, the open-loop amplifier is a degenerate common-source amplifier having a resistive load.

In embodiments, the open-loop amplifier comprises at least one current mirror.

In embodiments, the open-loop amplifier comprises a reference current generator to subtract a substantially constant current from the signal current injected into a load resistor.

In embodiments, the solid-state electric charge sensor comprises a second sample-and-hold (S/H) circuit connected to an output node of the open-loop amplifier.

In embodiments, the solid-state electric charge sensor comprises a first (S/H) connected to the column signal line.

Embodiments of the invention include a first sample-and-hold (S/H) circuit per column of pixel circuits which samples the reset level and signal level on the column signal line as well as a second S/H circuit which samples the reset level and signal level on an output node of the open-loop amplifier. Signal fusion of the acquired non-amplified signal and amplified signal may be selectively performed on chip or off chip (e.g., by a signal combiner), in order to increase the dynamic range. Otherwise stated, the solid-state electric charge sensor is in embodiments of the invention operative to combine the signals sampled by first sample-and-hold circuit and by second sample-and-hold circuit in order to form one signal having increased dynamic range compared to non-combined signals.

In embodiments, the second sample-and-hold circuit is operative to determine a difference between a first sample of the voltage at output node before signal charge is integrated on the sense node of charge detector circuit or transferred to sense node and a second sample at output node after signal charge is integrated on sense node or transferred to sense node.

In embodiments, the at least one charge detector circuit comprises a buffer device and a select switch, wherein the select switch is operative to selectably connect the at least one buffer device with one of the at least one column signal lines.

In embodiments, the at least one buffer device is operative such that the transconductance of the at least one buffer device is at least two times higher than required to attain a bandwidth of a signal on the column signal line needed to meet the corresponding frame rate requirement of the solid-state electric charge sensor and wherein the open-loop amplifier is operative such that the bandwidth of the signal on the output node of the open-loop amplifier is sufficient to meet the frame-rate requirement of the solid state electric charge sensor and which is at least two times lower than the bandwidth of the signal on the column signal line.

In embodiments, a voltage difference between the sense node and the column signal line takes a first value when the sense node is connected to the at least one feedback line, and a second value when sense node is not connected to feedback line, therefore obtaining a voltage shift modification. Accordingly, embodiments of the invention include a voltage shift modifier operative to modify the reset level, thereby increasing the non-saturated voltage swing of the image sensor. More specifically, the voltage shift modifier is operative to increase or decrease a voltage shift between a voltage on a sense node of a charge detector circuit and a voltage on a column signal line during a reset phase when negative feedback is applied to the amplifier. In particular the voltage shift modifier may modify the voltage shift of the source-follower transistor of the charge detector circuit by modification of the bias current provided to the source-follower transistor.

In embodiments, a method of operating the image sensor according to any of the preceding claims comprises performing at least the following procedures: performing a controlled transition from a conducting state of a reset transistor of the charge detector circuit to a non-conducting state of the reset transistor, wherein the resistance of the reset transistor is maintained in a range of values resulting in a product of the resistance (of the reset transistor) and the capacitance of the sense node greater or equal to the closed-loop settling time constant of the open-loop amplifier at the range of resistance values, the resistance being maintained in the range of values for a duration equal to or longer than the closed-loop settling time constant of open-loop amplifier at the range of resistance values. Otherwise stated, methods of signal readout include applying a controlled gradual transition to the gate terminal of the reset transistor of the pixel circuit. The controlled gradual transition may be chosen in a manner that allows reducing the impact of thermal noise generated in the channel of the reset transistor during the process of turning off the reset transistor by the use of negative feedback regulation by the open-loop amplifier.

In embodiments of the invention, open-loop amplifiers may include a subtractor operative to subtract a constant current from the signal current injected into a load resistor.

In embodiments, methods of signal readout include subtraction of correlated reset samples from signal samples.

In embodiments, methods of signal readout include subtraction of reset samples from signal samples wherein the reset noise contained in the signal samples may include components uncorrelated with the reset noise contained in the signal samples.

In embodiments, methods of signal readout include single sampling of a signal level.

DETAILED DESCRIPTION OF THE EMBODIMENTS OF THE INVENTION

Figure 2A:
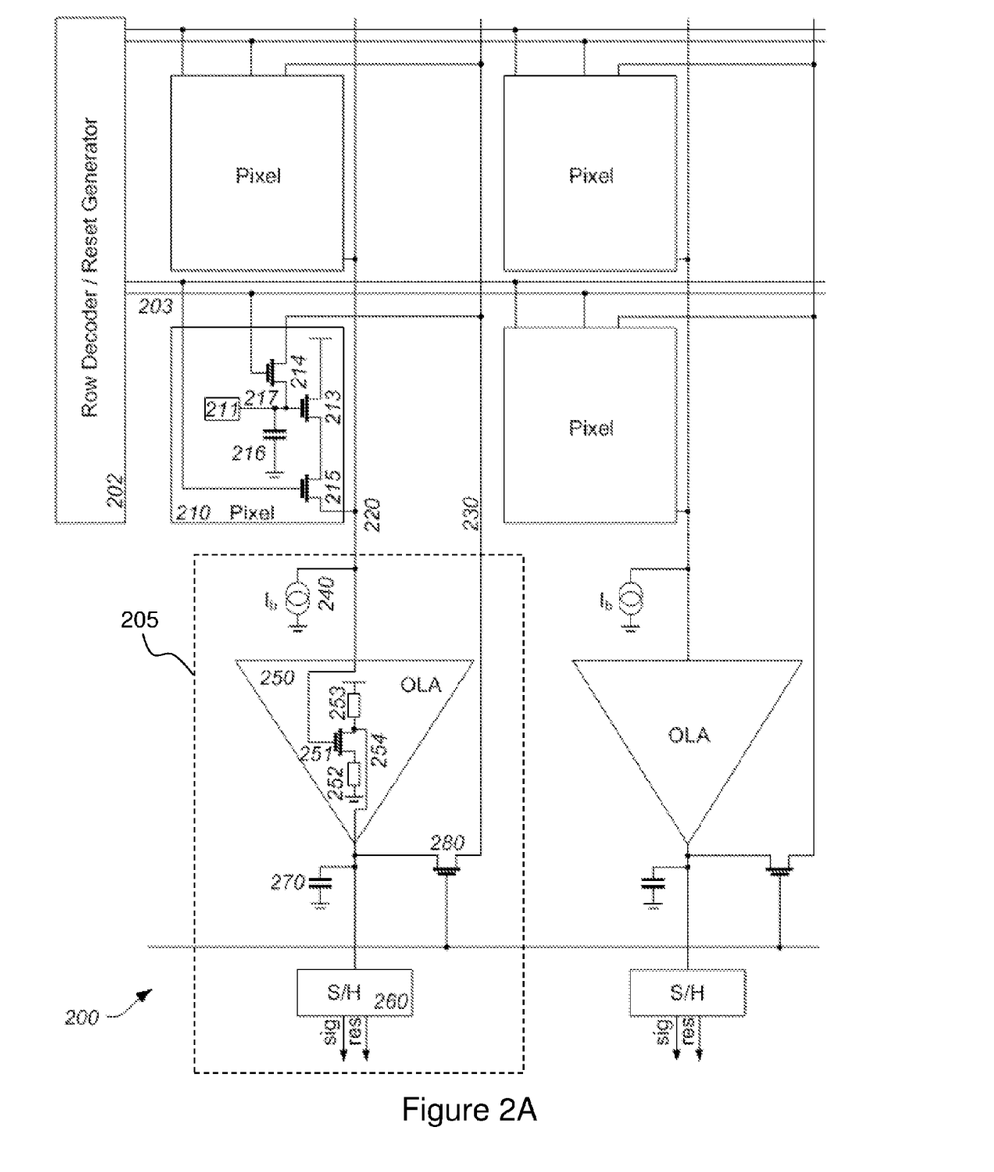
FIG. 2A is a schematic illustration of an electric charge sensor exemplified as an image sensor, according to an embodiment of the invention.

Reference is now made to FIG. 2A. An image sensor 200 includes a plurality of pixel circuits 210 that may be arranged according to a matrix configuration, wherein each of the plurality of pixel circuits 210 are operatively coupled with a signal-readout circuit 205 including inter alia, at least one column signal line 220, and at least one feedback line 230. Each column signal line 220 is connected to a current source 240 as well as to the input of an open-loop amplifier 250 with inverting moderate voltage gain and a low input referred noise voltage PSD. Output node 254 of open-loop amplifier 250 is connected to a load capacitor 270, which may be a parasitic capacitance, and to the input of an S/H circuit 260. A feedback switch 280 may, if activated, connect output node 254 of open-loop amplifier 250 to feedback line 230 of the corresponding column. Feedback switch 280 may, in some embodiments be omitted while feedback line 230 is connected to output node 254 permanently.

Pixel circuit 210 includes a photosensitive device 211, which is able to deliver signal charge onto a sense node 217 in response to incident light such as for example a buried photodiode with a transfer gate, a photogate, a charge-coupled device or a p-n-photodiode, a buffer device 213 implemented as a source-follower transistor with its drain terminal connected to a supply node, a select switch 215, which connects the source terminal of buffer device 213 with a column signal line 220 if activated, a sense node capacitor 216, which may be a parasitic capacitor, connected between sense node 217 and one or several alternating current (AC) ground nodes, and a reset transistor 214, which connects sense node 217 to feedback line 230 when activated.

A row decoder 202 generates the control signals for reset transistors 214 and select switches 215 of each pixel circuit 210.

Open-loop amplifier 250 may include an input transistor 251 with its gate terminal connected to the corresponding column signal line 220 and its drain terminal connected to output node 254, a source resistor 252 connected between the source terminal of input transistor 251, and a first constant potential, for example a ground potential, as well as a load resistor 253 connected between output node 254 and a second constant potential, for example a positive supply potential. The described configuration of open-loop amplifier 250 is a degenerate common-source amplifier with resistive load.

S/H circuit 260 samples and holds two consecutive voltage levels present on the amplifier output node 254. S/H 260 may optionally be operative to compute the difference between the two sampled voltage levels, for example, by employing a subtractor. S/H circuit 260 may contribute a substantial load capacitance to amplifier output node 254.

Image sensor 200 according to the embodiment of the present invention depicted in FIG. 2A may be operated using an operating sequence including the following two principal phases: during a first phase, which is referred to as reset phase hereinafter, select switch 215 and reset transistor 214 of an addressed pixel circuit 210 are both closed, and feedback switch 280, if present, is closed. In this configuration, a negative feedback loop is formed between open-loop amplifier 250, feedback line 230, sense node 217 of pixel circuit 210, buffer device 213 of pixel circuit 210 and column signal line 220. Due to the effect of negative feedback, amplifier 250 drives sense node 217 of the addressed pixel circuit 210 to a sense node reset voltage which results in a reset voltage level on column signal line 220 within the non-saturating input voltage range of open-loop amplifier 250.

Figure 2B:
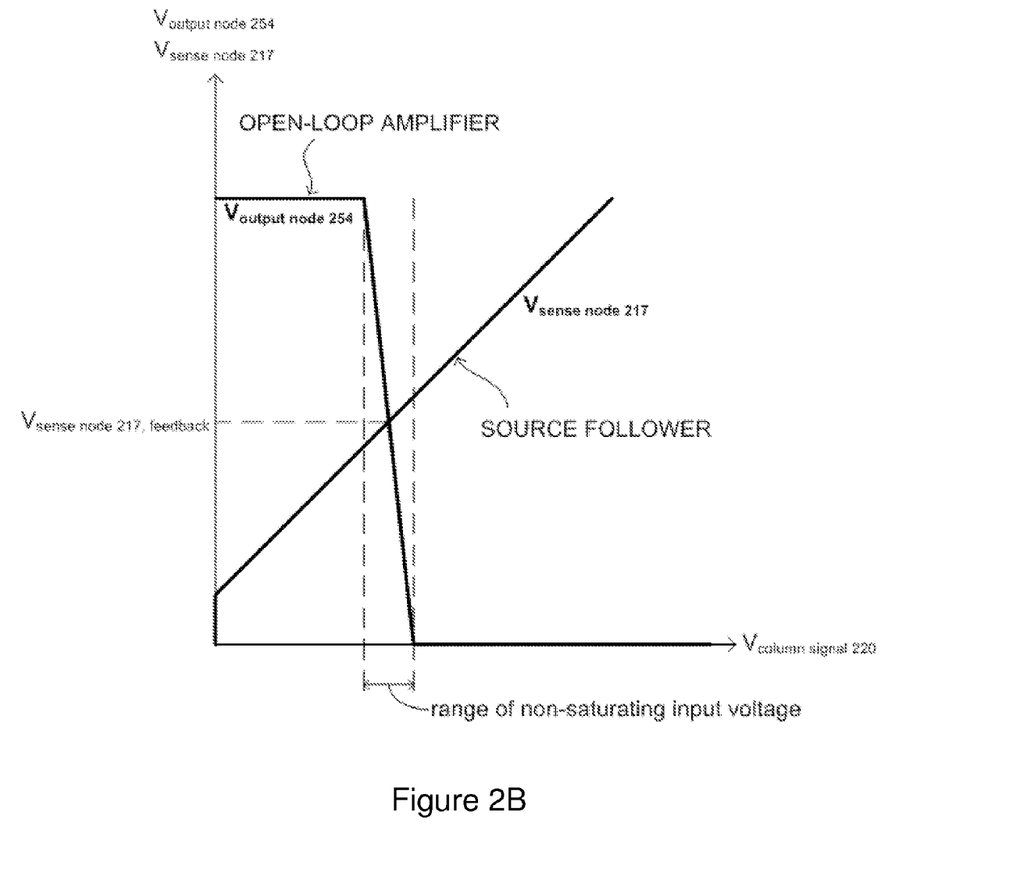
FIG. 2B is a schematic illustration of a simplified DC voltage transfer function of an open-loop amplifier as a function of the voltage on the corresponding column signal line, according to an embodiment of the invention; as well as a schematic illustration of a simplified DC voltage transfer function of a respective buffer device defined as voltage on the column signal line as a function of the voltage on a sense node of a charge detector circuit exemplified as a pixel circuit, according to an embodiment of the invention.

Additional reference is now made to FIG. 2B, which schematically illustrates a graph of a simplified DC voltage transfer function of open-loop amplifier 250 defined as the voltage on output node 254 as a function of the voltage on column signal line 220. Furthermore FIG. 2B schematically illustrates a simplified DC voltage transfer function of buffer device 213 defined as voltage on column signal line 220 as a function of the voltage on sense node 217. During reset phase of sense node 217 the voltage on output node 254 is at least approximately equal to the voltage on sense node 217. That is, since sense node 217 is connected to output node 254 across feedback switch 280 and reset transistor 214. Correspondingly, during the reset phase of sense node 217, the voltages on sense node 217 and on column signal line 220 are defined by the intersection of the DC voltage transfer function of open-loop amplifier 250 and the DC voltage transfer function of buffer device 213 as is schematically illustrated in FIG. 2B. It should be noted that the intersection naturally lies in the range of non-saturating input voltage of open-loop amplifier 250 even if either the DC voltage transfer function of open loop amplifier 250 or the DC voltage transfer function of buffer device 213 is shifted due to transistor offset effects.

During the amplification phase, feedback switch 280 and reset transistor 214 of the addressed pixel circuit 210 are open, while select switch 215 is still closed. In amplification phase, no feedback path exists and open-loop amplifier 250 provides on its output node 254 an amplified representation of the voltage on column signal line 220.

At the transition between reset phase and amplification phase, reset transistor 214 is opened and sense node 217 turns into a floating node. The amount of charge on sense node capacitor 216 is frozen and defines the sense node reset voltage. As outlined above, this voltage is naturally defined in a way to operate open-loop amplifier 250 at a non-saturating input voltage. Variations of gate-source voltage between buffer devices 213 of different pixel circuits 210 are attenuated by a factor of $1+A_{ol}$ by the use of this reset method where $A_{ol}$ is the voltage gain of open-loop amplifier 250. The described configuration during reset phase also attenuates DC offsets of open-loop amplifier 250 by a factor of $1+A_{ol}$, or in other words, variations of the DC voltage transfer function of open-loop amplifier 250 are at least partially compensated by the reset level resulting from the described feedback operation.

After a sufficient time for the voltage on output node 254 of open-loop amplifier 250 to settle to a stable level, S/H circuit 260 samples and holds a first value, referred to as the reset level, of the voltage on output node 254. Note that the term "stable" and grammatical variations thereof also encompass the meaning of "at least approximately stable". The term "stable" as used herein refers to a time-frame that may be determined with reference to the time constant τ defining the settling time of open-loop amplifier 250 and may range, for example, from 8*τ–10*τ.

In a next step signal charge from photosensitive device 211 is integrated on sense node 217 or transferred to sense node 217, for example by activating the transfer gate, in case photosensitive device 211 is a buried photodiode. During this step of transferring or integrating signal charge on sense node 217, select switch 215 of the investigated pixel circuit 210 may optionally be closed.

After waiting once more for a sufficient time for the voltage on output node 254 of open-loop amplifier to settle to a stable level while the sensor is in amplification configuration, S/H circuit 260 samples and holds a second value, referred to as the signal level, of the voltage on output node 254.

The sampled reset level may then be subtracted from the signal level in order to achieve a representation of the photo-generated signal charge amount practically free from reset noise of the sense node reset charge. Subtraction of the two sampled levels furthermore eliminates the remainder of the direct current (DC) offset of open-loop amplifier 250 and variations of gate-source voltage of buffer devices 213 which has not yet been suppressed by employing the reset phase steps using negative feedback, as outlined above. Note that the term "eliminating" as well as grammatical variations thereof also encompass the meaning "at least approximately eliminating". The sampling and subtraction operation outlined above with respect to the signal and reset level is referred to as correlated double sampling (CDS).

Figure 2C:
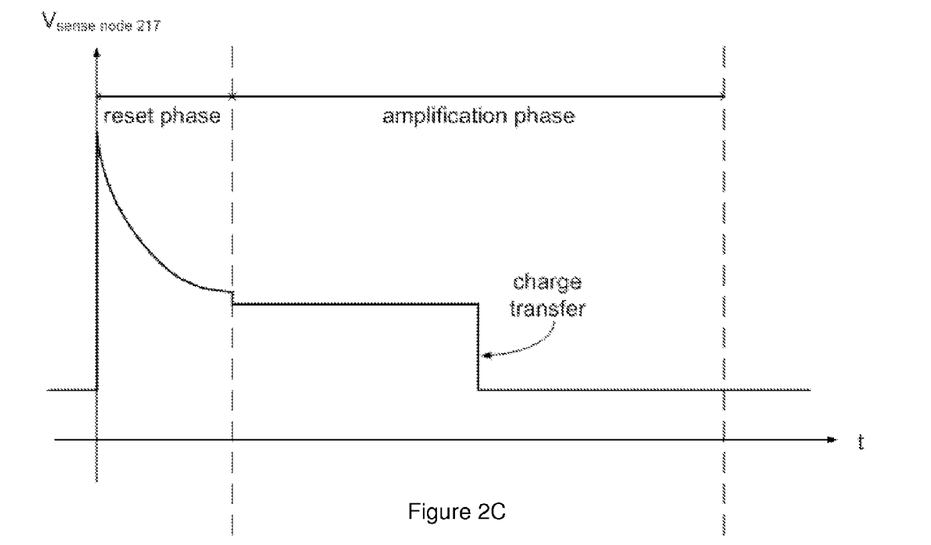
FIG. 2C is a schematic illustration of the qualitative evolution of the voltage on a sense node of the charge detector circuit exemplified as a pixel circuit, according to an embodiment of the invention.
Figure 2D:
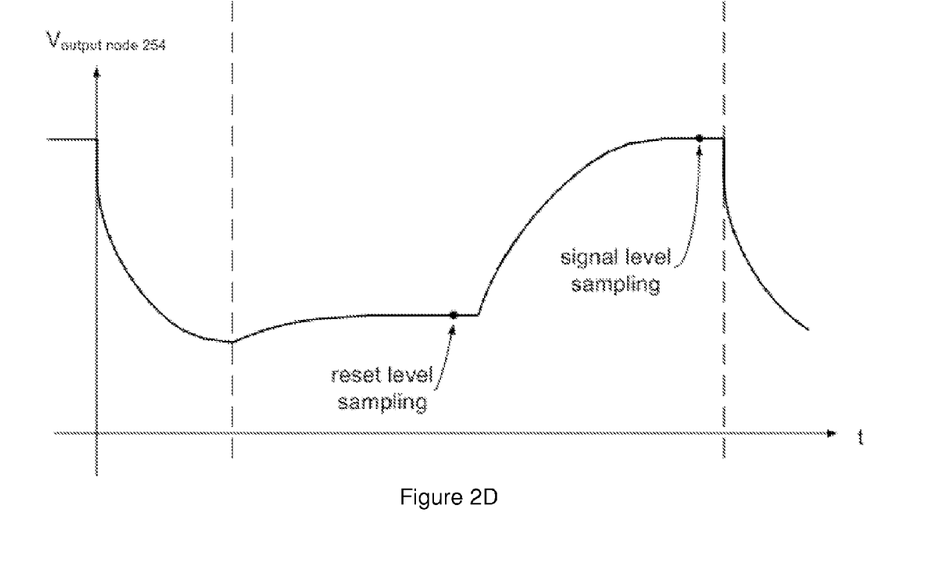
FIG. 2D is a schematic illustration of the qualitative evolution of the voltage on the output node of an open-loop amplifier in correspondence with the sense node of the charge detector circuit exemplified as a pixel circuit, according to an embodiment of the invention.

Further reference is made to FIG. 2C and FIG. 2D, which schematically illustrate an example of the qualitative evolution of the voltage on sense node 217 and the voltage on output node 254 of open-loop amplifier 250, respectively. Note that voltage amplitudes and temporal quantities are not necessarily drawn to scale. In the example illustrated in FIG. 2C and FIG. 2D charge is transferred from photosensitive device 211 onto sense node 217 at a predetermined charge transfer moment rather than being integrated continuously on said sense node 217. The shown waveforms therefore correspond, for example, to an embodiment wherein photosensitive device 211 is a buried photodiode with a transfer gate.

In the described embodiment of the invention, the overall capacitance of column signal line 220 is not increased by any particular measures. The overall capacitance of column signal line 220 includes parasitic line capacitance and input capacitance of open-loop amplifier 250. The gate width and length of buffer devices 213 as well as the column bias current defined by current source 240 are dimensioned to yield high transconductance of buffer devices 213 and low noise PSD of the voltage signal on column signal line 220. The bandwidth of the signal on column signal line 220, resulting from the transconductance of buffer devices 213 and the overall capacitance connected to column signal line 220, is significantly higher, for example by at least 2 to 10 times, than the requirement for meeting the output rate specification of image sensor 200.

The bandwidth of the signal on output node 254 of open-loop amplifier 250 is set as low as possible, given the operation constraints of image sensor 200, but still sufficient to match the requirement for meeting required readout rate of image sensor 200. The small signal transfer function of open-loop amplifier 250 of the embodiment of the invention depicted in FIG. 2A during amplification phase is given by the following EQN. 2.

$$\frac{v_o}{v_{col}} = -\frac{gm_{amp}R_2}{1+gm_{amp}R_1} \cdot \frac{1}{1+sR_2C_{load,amp}} \quad (2)$$

wherein $v_o$ represents the voltage on output node 254 of open-loop amplifier 250, $v_{col}$ represents the voltage on column signal line 220, $gm_{amp}$ represents the transconductance of input transistor 251, $R_1$ represents the resistance of source resistor 252, $R_2$ represents the resistance of load resistor 253, $C_{load,amp}$ represents the overall load capacitance connected to output node 254, and s is the complex signal frequency. Note that other mathematical expressions may be used for representing the small signal transfer function of open-loop amplifier 250. Note that $gm_{amp}$ is also a function of $v_{col}$. EQN. 2 illustrates that the bandwidth of open-loop amplifier 250 may be adjusted by selecting suitable values of $R_2$ and $C_{load,amp}$. The component $q_{n,sf}$ of the equivalent noise charge on sense node 217 due to thermal noise of buffer device 213 after low-pass filtering by open-loop amplifier 250 is expressed in EQN. 3 below:

$$q_{n,sf} = C_{sn} \sqrt{\int_0^\infty \frac{\gamma 4kT}{gm_{sf}} \left( \frac{1}{1+\omega C_{col}/gm_{sf}} \cdot \frac{1}{1+\omega R_2 C_{load,amp}} \right)^2 d\omega} \quad (3)$$

wherein $C_{sn}$ represents the capacitance of sense node capacitor 216, $gm_{sf}$ represents the transconductance of buffer devices 213, and $\omega$ represents the real part of the complex frequency s. Note that other mathematical expressions may be used to represent the ENC due to thermal noise in buffer device 213. Since the signal on column signal line 220 has a bandwidth that is significantly higher (e.g., by at least 10 times) than the bandwidth of the signal on output node 254 of open-loop amplifier 250, the value of $q_{n,sf}$ may be approximated by the expression given in EQN. 4 below:

$$q_{n,sf} \approx C_{sn} \sqrt{\frac{\gamma kT}{gm_{sf} R_2 C_{load,amp}}} \quad (4)$$

It should be noted that other mathematical expressions may be used to represent an approximation of the ENC due to thermal noise in buffer device 213.

Figure 2E:
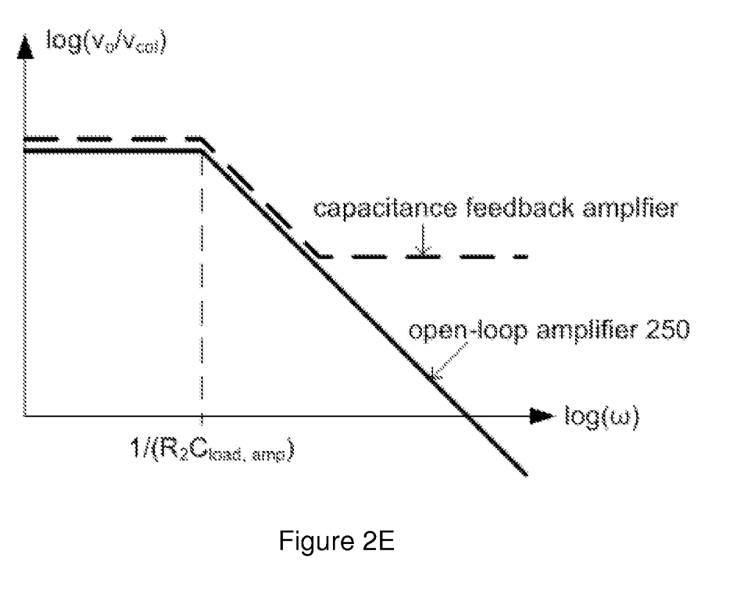
FIG. 2E is a schematic illustration of an asymptotic sketch of the amplitude of the small signal transfer function of the open-loop amplifier, according to an embodiment of the invention.

Additional reference is now made to FIG. 2E, which schematically illustrates an asymptotic sketch of the amplitude of the small signal transfer function of open-loop amplifier 250 according to EQN. 2. For comparison, FIG. 2E furthermore schematically shows the amplitude of the small signal transfer function (dashed line) of an inverting capacitance feedback amplifier as employed in column circuits of some image sensors known in the art. In this example, the low-frequency amplification as well as the transition frequency of the dominant pole, which defines the useful signal bandwidth of signal-readout circuit 205, are assumed to be equal to those of open loop amplifier 250 for comparison. Note that open-loop amplifier 250 provides stronger high frequency noise attenuation compared to a capacitance feedback amplifier as employed in the art.

A comparison of EQN. 1 and EQN. 4 shows that, if $R_2$ is chosen to be larger than $1/gm_{sf}$, the required load capacitance of open-loop amplifier 250 is reduced by a factor of $gm_{sf} \cdot R_2$ compared to the load capacitance $C_{load,conventional}$ of column line signal 120 required to achieve equivalent thermal noise from source-follower transistor 113 in an image sensor according to prior art.

Open-loop amplifier 250 adds electronic noise to the signal on its output node 254. If input transistor 251 has a sufficiently large gate area, the major component of the electronic noise is thermal noise. It can be mathematically shown that, if open-loop amplifier 250 is well designed for providing voltage amplification greater than unity, the thermal noise contributions of load resistor 253 as well as input transistor 251 are significantly smaller than the thermal noise contribution of source resistor 252. The ENC on sense node 217 due to noise of amplifier 250 can therefore be approximated by the simple expression of the following EQN. 5:

$$q_{n,amp} \approx C_{sn} \sqrt{\frac{kT}{\frac{R_2}{R_1} C_{load,amp}}} \quad (5)$$

It should be noted that alternative expressions may be used to represent the sense node ENC due to thermal noise of open-loop amplifier 250.

Due to the bandwidth-reducing effect of amplification by open-loop amplifier 250, the overall capacitance $C_{load,amp}$ at output node 254 of open-loop amplifier 250 required for achieving low input referred noise is reduced by a factor of $R_2/R_1$ with respect to a unity-gain buffer. From a comparison of EQN. 5 with EQN. 4 it can be concluded that noise from open-loop amplifier 250 does not excessively compromise the overall noise performance as long as $R_1$ is smaller or equal than $\gamma/gm_{sf}$. The absence of noise non-ideality factor $\gamma$ in EQN. 5 illustrates the fact that the electronic component converting input voltage into current, which is the dominant noise contributor, is source resistor 252 rather than an input transistor such as, for example, input transistor 251. As for most transistors manufactured using state-of-the-art CMOS processes, $\gamma$ is greater than 1, a degenerate common-source amplifier, such as open-loop amplifier 250 of the discussed embodiment, offers lower input referred thermal noise for a given load capacitance than amplifiers that employ MOS transistors as transconductance elements, such as standard common-source amplifiers or differential pairs.

As an example, it can be found from EQN. 4 and EQN. 5 that for $R_1=20$ kOhms, $R_2=200$ kOhms, $1/gm_{sf}=20$ kOhms, and $\gamma=2$, at sense node 217 an overall ENC of the thermal noise, from both buffer device 213 and open-loop amplifier 250, as low as 0.5 electrons can be achieved at room temperature through the use of an overall capacitance $C_{load,amp}$ of as little as 4.8 picoFarads connected to output node 254 of open-loop amplifier 250.

Moreover, by employing open-loop amplifier 250 according to an embodiment of the invention schematically illustrated in FIG. 2A, an amplifier using resistors as transconductance devices and load devices has inherent linear operation characteristics. If source resistor 252 and load resistor 253 are chosen to be identical physical types of resistors, matched layouts may enable high reproducibility and low temperature drift of the amplification of open-loop amplifier 250 which, according to EQN. 2, is approximately given by the ratio between the resistance of source resistor 252 and load resistor 253, if the transconductance of input transistor 251 is much higher (e.g., by at least 10 times) than $1/R_1$ and the drain-source resistance of input transistor 251 is much higher than $R_2$.

Different embodiments of open-loop amplifier 250 may be used without leaving the scope of the invention. In particular, embodiments may comprise any active solid state devices such as pnp and npn bipolar transistors, n-type and p-type MOS transistors or a combination thereof.

Figure 3:
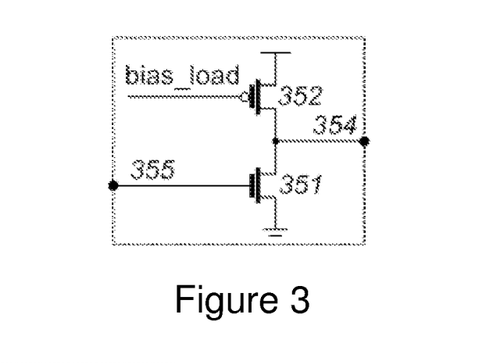
FIG. 3 is a schematic illustration of a common-source open-loop amplifier used in an electric charge sensor according to an alternative embodiment of the invention.

Making now further reference to FIG. 3, a possible first alternative embodiment of open-loop amplifier 250 may include an input transistor 351 and a load transistor 352. The source terminal of input transistor 351 is connected to a constant potential, such as a ground potential, the gate terminal of input transistor 351 is connected to a column line gate terminal 355, and the drain terminal of input transistor 351 is connected to an amplifier output node 354. Load transistor 352 may be of opposite channel type than input transistor 351. The source terminal of load transistor 352 is connected to a constant potential, such as a supply potential, the gate potential of load transistor 352 is connected to a constant bias voltage, and the drain terminal of load transistor 352 is connected to output node 354. This first alternative embodiment of open-loop amplifier 250, as depicted in FIG. 3, may offer the advantage of higher open-loop voltage amplification at the expense of lower linearity and increased input-referred noise power spectral density compared to the embodiment of open-loop amplifier 250, as depicted in FIG. 2A. Note that the illustrated embodiment of load transistor 352 is not to be construed as limiting. In particular, load transistor 352 may be implemented as a resistor or a MOS-transistor connected in diode configuration instead of a current source.

Circuit analysis shows that the influence of finite drain-source resistance due to short channel effects in MOS-transistors may compromise the linearity and the reproducibility of the gain of the embodiment of open-loop amplifier 250 schematically shown in FIG. 2A. Furthermore, the voltage drop over source resistor 252 is limited to a low value if the open-loop amplification is moderately high (e.g., is for example at least 10), and the supply voltage is relatively low, for example 3.3 V or 1.8 V. For this reason it may be difficult to obtain a transconductance $gm_{amp}$ of input transistor 251 high enough compared to the resistance $R_1$ of source resistor 252. Limited transconductance may therefore be an additional source of nonlinearity and gain variation between different open-loop amplifiers 250.

Figure 4:
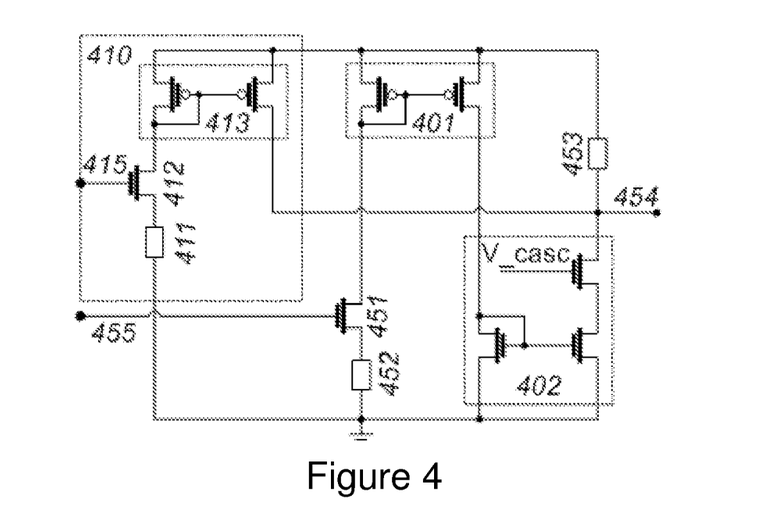
FIG. 4 is a schematic illustration of an open-loop amplifier offering improved linearity and gain reproducibility used in an electric charge sensor, compared to the open-loop amplifiers illustrated in FIG. 2 and FIG. 3, according to another embodiment of the invention.

Further referring to FIG. 4, a second alternative embodiment of open-loop amplifier 250 is schematically illustrated. The second alternative embodiment of open-loop amplifier may include an input transistor 451 with its gate terminal 455 connected to column signal line 220, a source resistor 452 connected between a constant potential, such as a ground potential, and the source terminal of input transistor 451, a first current mirror 401 with its input connected to the drain terminal of input transistor 451 and its output connected to the input of a second current mirror 402, and a load resistor 453 connected between an output node 454 and a constant potential, for example a positive supply potential. The output of second current mirror 402 is connected to output node 454. Second current mirror 402 may include a cascode transistor in order to increase its output resistance for reduction of the impact of high voltage swing on output node 454. The described second alternative embodiment may furthermore include a reference current generator 410, which injects a constant current into output node 454. Reference current generator 410 may include a reference input transistor 412 with its gate terminal connected to a reference potential line 415, a reference resistor 411 connected between the ground potential and the source terminal of reference input transistor 412, and a third current mirror 413 with its input connected to the drain terminal of reference input transistor 412 and its output connected to output node 454. The types and geometries of reference input transistor 412 and reference resistor 411 may be matched with those of input transistor 451 and source resistor 452, respectively. Third current mirror 413 may, for example, provide an output to input current ratio of 3:8. First current mirror 401 may, for example, provide an output to input current ratio of 1:1. Second current mirror 402 may, for example, provide an output to input current ratio of 2:1. The voltage level present on reference potential line 415 may be a constant potential from a reference source. Alternatively, the voltage level present on reference potential line 415 may be generated from a constant voltage source in combination with a matched replica of buffer device 213 and current source 240.

The current flowing across load resistor 453 results from subtracting the reference current generated by reference current generator 410 from an input voltage dependent signal current generated in source resistor 452 mirrored by first current mirror 401 and second current mirror 402. Due to this subtraction it is possible to obtain a significant voltage drop of, for example at least 100 mV, 200 mV, 300 mV or 400 mV, across source resistor 452 and to maintain a moderately high voltage gain, for example of at least 10, while a low supply voltage, such as for example of 1.8 V or 3.3 V, is sufficient to operate the circuit. The resulting significant voltage drop across source resistor 452 allows reducing the impact of finite transconductance of input transistor 451. Due to the low voltage swing at the input of first current mirror 401 as a result of the comparably low input impedance of first current mirror 401, the impact of finite drain-source resistance of input transistor 451 is reduced in comparison to the embodiment of open-loop amplifier 250 as schematically depicted in FIG. 2A.

For the reasons outlined above, the second alternative embodiment of open-loop amplifier 250 depicted in FIG. 4 may offer excellent linearity, for example less than 0.5% of gain variation, over a practical output voltage range of for example 1.5V.

In the embodiment schematically depicted in FIG. 2A, the configuration of the reset phase resets the sense node to a voltage that results in a reset level on column signal line 220 situated between the upper limit and the lower limit of the non-saturated input range of open-loop amplifier 250. The exact level of the reset level is governed by the criteria that the output voltage of open-loop amplifier 250 is equal to the input voltage of open-loop amplifier 250 plus the gate-source voltage shift of buffer device 213. Note that the term equal and grammatical variations thereof also encompass the meaning of at least approximately equal. Furthermore, charge injection from reset transistor 214 onto sense node 217 at the transition between reset phase and amplification phase may result in further lowering of the reset level on column signal line 220. Since the signal level on column signal line 220 is generally lower than said reset level, it would be desirable to achieve a reset level on column signal line 220 as close as possible to but still below the upper limit of the non-saturated input range of open-loop amplifier 250 in order to obtain maximum signal swing for image sensor 200.

Figure 5:
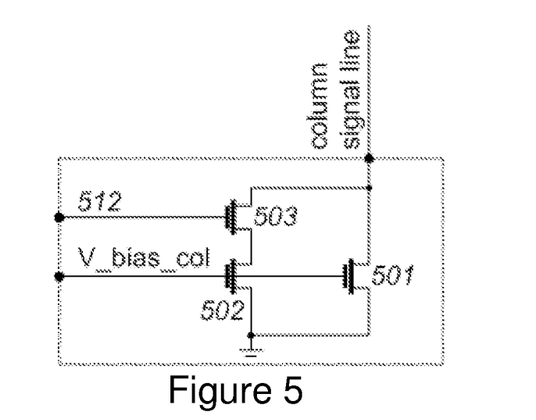
FIG. 5 is a schematic illustration of a current source used for biasing of a source-follower transistor in an embodiment of the invention.

Additional reference is now made to FIG. 5. An alternative embodiment of current source 240 may achieve the desired increase of the reset level compared to current sources known in the art. The alternative embodiment of current source 240 provides increased bias current during the reset phase compared to its bias current during amplification phase. The gate-source voltage shift of buffer device 213 is therefore higher during reset phase than during amplification phase. The reset level on column signal line 220 during the amplification phase is therefore increased, for example by 10 mV to 100 mV, compared to the input operating point of open-loop amplifier 250 defined by negative feedback during the reset phase. The described increase of the reset level on column signal line 220 may be used in order to exploit as much as possible of the non-saturated input range of open-loop amplifier 250.

With reference to FIG. 5, such an alternative embodiment of current source 240 may include a first current source transistor 501 with its source terminal connected to a constant or at least approximately constant potential, such as a ground potential, and its drain terminal permanently connected to column signal line 220, a second current source transistor 502 with its source connected to the constant potential and its drain connected to a first terminal of a bias reset switch 503. The gate terminals of first current source transistor 501 and second current source transistor 502 are connected to a constant bias voltage. A second terminal of bias reset switch 503 is connected to column signal line 220, and the gate 512 of bias reset switch 503 is connected to a reset signal which may be equal or at least approximately equal to the reset signal controlling feedback switch 280 or a time-shifted version thereof. It should be noted that the alternative embodiment of current source 240 described above is not to be construed as limiting. Other embodiments offering equivalent characteristics may be obvious to those skilled in the art. For example, second current source transistor 502 may in some embodiments of the invention be replaced by a current digital-to-analog converter made from a multitude of current sources each providing a fraction of the required bias current.

If open-loop amplifier 250 of the embodiment of the invention depicted in FIG. 2A provides moderate voltage amplification ranging for example between 2 to 100, the non-saturated input swing of open-loop amplifier 250 is generally smaller than the non-saturated swing of the voltage level on column signal line 220. A loss of overall signal charge handling capacity is therefore obtained. A parallel non-amplifying readout path per column may allow reading out a non-saturated representation of the signal level on column signal line 220. The signal read out using the non-amplifying readout path may be subjected to higher input referred ENC than the signal read out across the readout path employing an open-loop amplifier. Signal fusion of the amplified signal for levels below the saturation point of the amplifying readout path and of the non-amplified signal beyond the saturation point may produce a large-swing, low-noise output of, e.g., an image.

Figure 6:
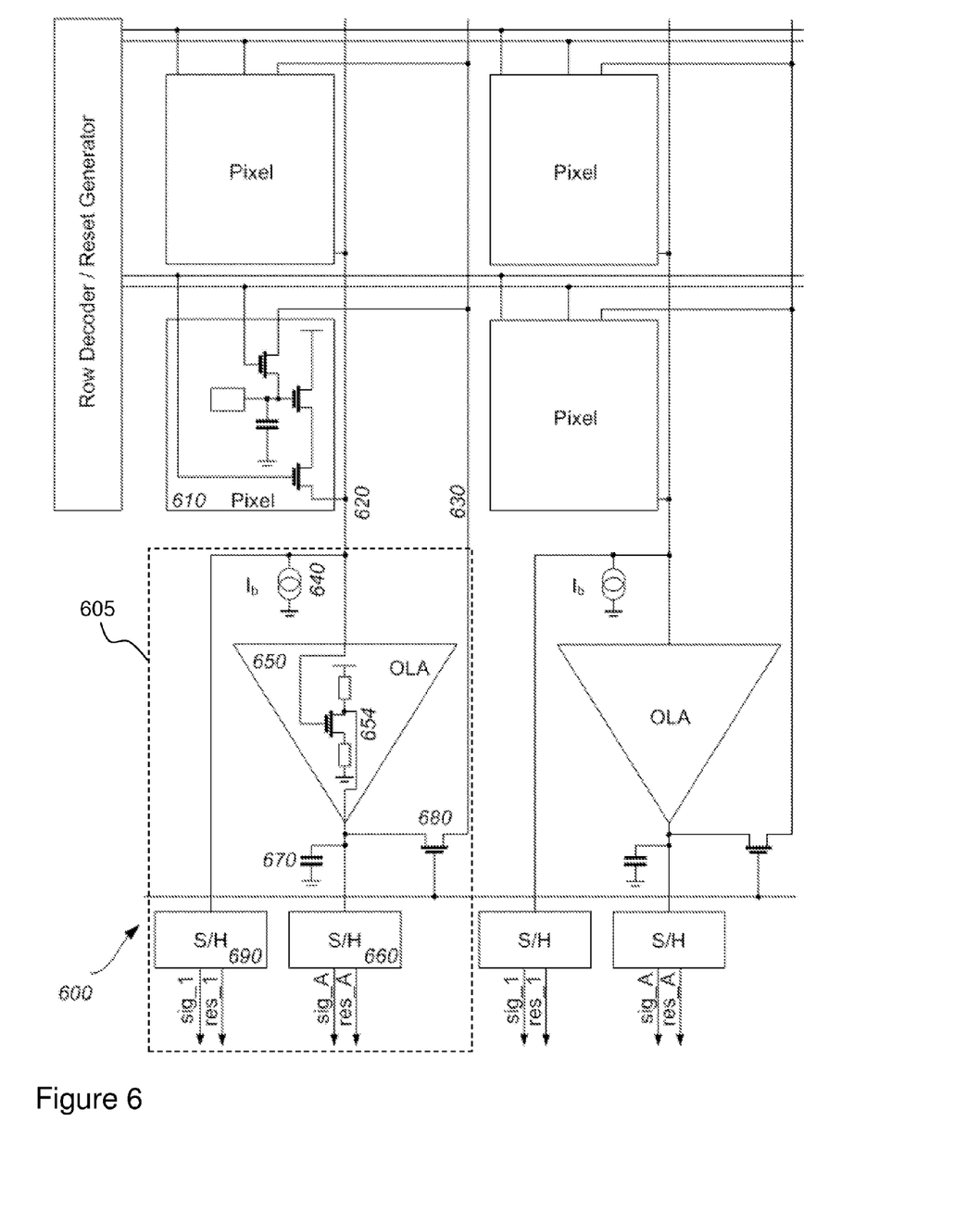
FIG. 6 is a schematic illustration of an embodiment of the invention featuring dual readout per column for increased dynamic range.

Additional reference is now made to FIG. 6. An image sensor 600 according to an embodiment of the invention has a dual readout path and may include a plurality of pixel circuits 610 arranged in a matrix that are operatively coupled with a signal-readout circuit 605 inter alia including at least one column signal line 620, and at least one feedback line 630. The at least one column signal line 620 may be connected to a current source 640, to the input of an open-loop amplifier 650, and to the input of a first S/H circuit 690. An output node 654 of open-loop amplifier 650 is connected to a load capacitor 670, which may be a parasitic capacitance, to a feedback switch 680, which connects output node 654 to feedback line 630 when activated, and to a second S/H circuit 660. The embodiments of pixel circuits 610, current source 640 and open-loop amplifier 650 depicted in FIG. 6 correspond to their respective counterparts of the embodiment of the invention shown in FIG. 2A. These embodiments are not to be construed as limiting. In particular, alternative embodiments of open-loop amplifier 650, for example as depicted in FIG. 3 and FIG. 4, and alternative embodiments of current source 640, for example as depicted in FIG. 5, may be used.

During the amplification phase, but prior to transferring signal charge to or integrating signal charge on the sense node of the corresponding pixel circuit 610, first S/H circuit 690 samples the non-amplified reset level on column signal line 620. Second S/H circuit 660 simultaneously samples and holds the amplified reset level on output node 654 of open-loop amplifier 650. It should be noted that the term "simultaneous" as well as grammatical variations thereof also encompass the meaning of "at least approximately simultaneous". Again in the configuration of the amplification phase, but after transferring signal charge to or integrating signal charge on the sense node of the corresponding pixel circuit 610, first S/H circuit 690 samples the non-amplified signal level on column signal line 620. Second S/H circuit 660 simultaneously samples and holds the amplified signal level on output node 654 of open-loop amplifier 650.

First S/H circuit 690 is optionally operative to subtract the sampled non-amplified reset level from the signal level, for example, by employing a subtractor. Accordingly, the output of S/H circuit 690 either provides the non-amplified reset level as well as the non-amplified signal level, or its output provides the difference thereof. Since the signal sampled by first S/H circuit 690 is used in the range of signal level above a certain threshold, where photon shot noise has a high impact, a relatively high level of thermal noise, for example an ENC of 10 to 20 electrons, is acceptable here. If first S/H circuit 690 mainly includes one or several sampling switches and one or several sampling capacitors for the sampled reset value as well as for the sampled signal value, the value of the sampling capacitors may be chosen to be relatively low, for example 500 femto-Farads to 1.5 pico-Farads. The described embodiment of first S/H circuit 690 is not to be construed as limiting. Other embodiments will be apparent to those skilled in the art. In particular, first S/H circuit 690 may include at least one unity-gain buffer, such as a source-follower or unity-gain feedback amplifier, which buffers the signal on column signal line 620 in order to reduce the input capacitance of first S/H circuit 690.

Second S/H 660 circuit may optionally be operative to subtract the sampled amplified reset level from the signal level, for example, by employing a subtractor. Accordingly, its output either provides the amplified reset level as well as the amplified signal level, or its output provides the difference thereof.

Fusion or combining of the large-swing output signal of first S/H circuit 690 and the low noise output signal of second S/H circuit 660 of an image sensor provides images with excellent intra-scene dynamic range, for example of 90 dB. The signal fusion may be performed by a signal combiner (not shown), e.g., as known in the art.

Different operating sequences than the CDS sequence described previously may be used to operate embodiments of image sensors according to the present invention. For example, single signal sampling instead of CDS, may be employed.

Reverting to FIG. 2A, it should be noted that the operating sequences according to an alternative embodiment of the invention described below may generally be applied to any embodiment of the present invention.

The alternative operating sequence first resets the voltage on sense node 217 during a reset phase, where select switch 215 is closed, reset transistor 214 is closed, and feedback switch 280 is closed. In a following amplification phase, reset transistor 214 is open and feedback switch 280 is open while select switch 215 is still closed. During amplification phase, signal charge from photosensitive device 211 is transferred to sense node 217, for example by activating the transfer gate, in case photosensitive device 211 is a buried photodiode. After a sufficient time for the voltage level on output node 254 of open-loop amplifier 250 to settle to a stable level, S/H circuit 260 samples and holds a value, referred to as the single-sampled signal level, of the voltage on output node 254 of open-loop amplifier 250.

The above-described operating sequence according to the alternative embodiment of the invention does not involve sampling of a reset level and subsequent subtraction of such a reset level from the signal level. Therefore, particular attention is paid to the noise component on sense node 217 which is frozen at the transition between reset phase and amplification phase. This noise component is hereinafter referred to as reset noise.

The alternative operating sequence may include a controlled gradual transition of the reset signal 203 applied to the gate of reset transistor 214 by row decoder 202 at the transition between reset phase and amplification phase. In particular, the fall time of reset signal 203 may be chosen to maintain an on-resistance of reset transistor 214 high enough to result in a product of the on-resistance times the capacitance $C_{sn}$ of sense node 217 equal or higher than the time constant of open-loop amplifier 250 in reset configuration during at least the duration of the time constant. If this condition is respected, the feedback loop of the reset configuration may attenuate the thermal noise of reset transistor 214 by closed loop regulation during the process of gradually removing the channel charge of reset transistor 214. The resulting frozen noise charge amount on sense node 217 (i.e., the charge amount remains at least approximately constant) is therefore reduced to an amount below the value of $kTC_{sn}$ found in the case of very short fall time of reset signal 203 as is known in the art and for example described by R. Sarpeshkar, T. Delbruck, and C. A. Mead, in "White noise in MOS transistors and resistors", IEEE Circuits Devices Mag., pp. 23-29, November 1993. The noise charge amount may, for example, be 2 times to 20 times below the value of $kTC_{sn}$. The required fall time of reset signal 203 according to the alternative embodiment of the invention depends on the capacitance $C_{sn}$ of sense node capacitor 216, the properties of reset transistor 214, and the closed-loop bandwidth of open-loop amplifier 250 and may be as low as 100 ns for example or as high as 10 µs for example. In order to generate the controlled gradual transition of reset signal 203 row decoder 202 may include a ramp generator (not shown) such as a capacitor driven by a current-starved inverter for example.

The fact that the described alternative operating sequence requires the readout of only one single-sampled signal level rather than a correlated pair of a reset level and a signal level makes it particularly interesting for global shutter operation of a matrix of pixel circuits 210 if the latter is able to integrate signal charge on an integration site independent of sense node 217 and to transfer integrated signal charge onto sense node 217 upon triggering of a control signal. More specifically, in global shutter operation, the exposure periods of each and every pixel in a sensor are simultaneous producing distortion-free images, as is known in the art. With respect to image sensors employing buried photodiodes, the exposure time is defined as the period between two consecutive charge transfers onto the sense node (cf. FIGS. 2C and 2D). Therefore, to obtain global shutter operation, all pixels need to perform their charge transfer simultaneously. With respect to the above described embodiments wherein the output signal of a pixel is sampled twice with correlated components of reset noise, global shutter operation is quite difficult to implement. That is, since sampling would have to be performed a first time before charge transfer and a second time after charge transfer, thus requiring sequentially addressing each row, perform the reset phase, go to amplification phase read out the reset level (and store all the reset levels in a computer) before charge transfer, then perform simultaneous charge transfer onto the sense node, and finally address each row one more time after charge transfer, establish the amplification phase and read the signal level. However, the above outlined alternative operating sequence, which may also referred to as "single signal sampling", removes the need for going to amplification phase, read and store the reset levels. The penalty is lack of cancelling of reset noise (as there is no subtraction of a correlated reset level). However the impact of this penalty is reduced, since the reset noise is lowered in amplitude when applying above-outlined controlled slow transition of the reset signal of a matrix of pixel circuits 210.

According to the alternative embodiment of the invention, sequential reset of all pixel circuits 210 sharing a common column signal line 220 and a common feedback line 230 followed by global transfer of signal charge onto sense nodes 217 of said pixel circuits 210, and finally sequential amplification and sampling of the single-sampled signal levels of said pixel circuits 210 will result in global shutter operation featuring integrate-while-read functionality. Photosensitive devices that include independent integration sites and controlled charge transfer from the integration site to a sense node 217 include but are not limited to buried photodiodes with transfer gates, photo-gates, and CCDs.

Note that a residual component of variation of gate-source voltage of buffer device 213 and offset of open-loop amplifier 250 is present in the single-sampled signal level. In order to overcome this limitation, the method of applying a controlled gradual transition of the reset signal 203 provided by row decoder 202 to the gate of reset transistor 214 at the transition between reset phase and amplification phase may be used in conjunction with non-correlated double sampling of the signal on output node 254 of open-loop amplifier 250. Thanks to the reduction of reset-noise by use of said gradual transition of reset signal 203, subtraction of non-correlated samples results in a combination of low overall noise, cancellation of circuit offsets and global shutter operation.

A global shutter non-correlated double sampling operating sequence includes the following steps: in a first step signal charge is transferred from the independent integration site of the photosensitive devices 211 to the sense nodes 217 of all pixel circuits 210 simultaneously while the select switches 215 are open. In a next step, select switches 215 of all the pixel circuits 210 sharing a common column signal line 220 and common feedback line 230 are closed sequentially. While select switch 215 of a given pixel circuit 210 is closed the configuration of the amplification phase is first used i.e. feedback switch 280 and reset transistor 214 are open. During this amplification phase S/H circuit 260 samples and holds the signal level on output node 254 of open-loop amplifier 250. While the select switch 215 of given pixel circuit is still closed, reset transistor 214 and feedback switch 280 are closed during a following reset phase. After a sufficient time for the voltage on sense node 217 to be reset, row decoder 202 applies a controlled gradual transition to the gate of reset transistor 214 and feedback switch 280 is opened to establish once more the configuration of the amplification phase while the select switch 215 of the given pixel circuit 210 is still closed. After applying the amplification phase for a sufficient time, S/H circuit 260 selectively samples the reset level on output node 254 of open loop amplifier 250 before select switch 215 of the given pixel circuit 210 is opened and the next pixel circuit 210 is selected. The signal level and reset level consecutively sampled by S/H circuit 260 may be subtracted for suppression of offsets in open loop amplifier 250 and the gate-source voltage of buffer device 213. This subtraction does not yield any cancellation or improvement of reset noise, as the reset noise components present in the two subtracted samples are not correlated due to the fact that sense node 217 has been reset between the acquisition of the consecutively sampled reset level and signal level.

The global shutter operation using either the single signal sampling sequence or the non-correlated double-sampling sequence described previously might be of particular interest for applications requiring high pixel readout rate. The open-loop settling time of open-loop amplifier 250 might be insufficient to achieve such high readout rates. A possible solution to achieve high pixel readout rate is found in the usage of the embodiment depicted in FIG. 6 where no signal fusion is performed. This means that the signal sampled and held by second S/H circuit 660 is discarded. In particular embodiments, second S/H circuit 660 may be omitted.

Any person skilled in the art will appreciate that different embodiments of the invention may be suggested without deviating from the scope of the invention. Accordingly, n-type (metal-oxide semiconductor) MOS transistors may be replaced by p-type MOS transistors and vice versa in some embodiments. MOS transistors may be replaced by bipolar transistors in some embodiments. Furthermore, circuit elements may be shared among pixel circuits in order to decrease the physical size of pixel circuits and column circuits may be shared by several columns of pixel circuits by multiplexing for example.

It should be noted that although embodiments of the present invention are disclosed in connection with photon detection, this should not be construed as limiting. Accordingly, embodiments of the present invention may additionally or alternatively be employed in connection with microelectrode arrays, e.g., for in vivo and/or in vitro, and/or in any application requiring readout of signals.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions.

It should be understood that where the claims or specification refer to "a" or "an" element, such reference is not to be construed as there being only one of that element.

What is claimed is:

1. A solid-state electric charge sensor comprising:
   at least one charge detector circuit operatively coupled with at least one signal-readout circuit comprising a current source and a column signal line
   characterized in that
   said at least one signal-readout circuit further comprises at least one open-loop amplifier having an output node and an input node wherein said input node is operatively connected with said at least one column signal line and with said at least one current source;
   at least one feedback line that is operatively connectable with said output node of said at least one open-loop amplifier;
   wherein said at least one charge detector circuit, which comprises a sense node, is selectively connectable with a selected one of said feedback lines to form a negative feedback loop; and
   wherein said open-loop amplifier has an inverting voltage gain.

2. The solid-state electric charge sensor according to claim 1 characterized in that the bandwidth of said at least one open-loop amplifier is smaller than the bandwidth of the signal on said at least one column signal line.

3. The solid-state electric charge sensor according to claim 1, characterized in that said open-loop amplifier is a degenerate common-source amplifier comprising a load resistor.

4. The solid-state image sensor according to claim 3, characterized in that said open-loop amplifier comprises at least one current mirror.

5. The solid-state image sensor according to claim 3, characterized in that said open-loop amplifier comprises a reference current generator to subtract a substantially constant current from the signal current injected into a load resistor.

6. The solid-state electric charge sensor according to claim 1, characterized by furthermore comprising a second sample-and-hold circuit connected to an output node of said open-loop amplifier.

7. The solid-state electric charge sensor according to claim 6, characterized by comprising a first sample-and-hold circuit connected to said column signal line.

8. The solid-state electric charge sensor according to claim 6, characterized in that said second sample-and-hold circuit is operative to determine a difference between a first sample of the voltage at output node before signal charge is integrated on said sense node of charge detector circuit or transferred to sense node and a second sample at output node after signal charge is integrated on sense node or transferred to sense node.

9. The solid-state electric charge sensor according to claim 7 characterized by being operative to combine the signals sampled by first sample-and-hold circuit and by second sample-and-hold circuit in order to form one signal having increased dynamic range compared to non-combined signals.

10. The solid-state electric charge sensor according to claim 1, characterized in that said at least one charge detector circuit comprises a buffer device and a select switch, wherein said select switch is operative to selectably connect said at least one buffer device with one of said at least one column signal line.

11. The solid-state electric charge sensor according to claim 10, characterized in that said at least one buffer device is operative such that the transconductance of said at least one buffer device is at least two times higher than required to attain a bandwidth of a signal on said column signal line needed to meet the corresponding frame rate requirement of said solid-state electric charge sensor and wherein said open-loop amplifier is operative such that the bandwidth of the signal on the output node of said open loop amplifier is sufficient to meet the frame-rate requirement of said solid state electric charge sensor and which is at least two times lower than the bandwidth of the signal on said column signal line.

12. The solid-state electric charge sensor according to claim 1, wherein a voltage difference between said sense node and said column signal line takes a first value when said sense node is connected to said at least one feedback line, and a second value when said sense node is not connected to feedback line, therefore obtaining a voltage shift modification.

13. The method of operating the image sensor of claim 1, characterized by performing at least the following procedures:
   performing a controlled transition from a conducting state of a reset transistor of said charge detector circuit to a non-conducting state of said reset transistor, wherein the resistance of said reset transistor is maintained in a range of values resulting in a product of said resistance and the capacitance of said sense node greater or equal to the closed-loop settling time constant of said open-loop amplifier at said range of resistance values, the resistance being maintained in said range of values for a duration equal to or longer than said closed-loop settling time constant of open-loop amplifier at said range of resistance values.

14. The solid-state electric charge sensor according to claim 4, characterized in that said open-loop amplifier comprises a reference current generator to subtract a substantially constant current from the signal current injected into a load resistor.

15. The solid-state electric charge sensor according to claim 14, characterized by furthermore comprising a second sample-and-hold circuit connected to an output node of said open-loop amplifier.

16. The solid-state electric charge sensor according to claim 15, characterized by furthermore comprising a first sample-and-hold circuit connected to said column signal line.

17. The solid-state electric charge sensor according to claim 16, characterized by being operative to combine the signals sampled by a first sample-and-hold circuit and by second sample-and-hold circuit in order to form one signal having increased dynamic range compared to non-combined signals.

18. The solid-state electric charge sensor according to claim 11, wherein a voltage difference between said sense node and said column signal line takes a first value when said sense node is connected to said at least one feedback line, and a second value when said sense node is not connected to feedback line, therefore obtaining a voltage shift modification.

* * * * *